(12) United States Patent
Doi et al.

(10) Patent No.: US 8,916,946 B2
(45) Date of Patent: Dec. 23, 2014

(54) OPTICAL SEMICONDUCTOR DEVICE

(71) Applicants: Nippon Telegraph and Telephone Corporation, Tokyo (JP); NTT Electronics Corporation, Yokohama-shi, Kanagawa (JP)

(72) Inventors: Yoshiyuki Doi, Atsugi (JP); Yoshifumi Muramoto, Atsugi (JP); Takaharu Ohyama, Yokohama (JP)

(73) Assignees: Nippon Telegraph and Telephone Corporation, Tokyo (JP); NTT Electronics Corporation, Kanagawa (JP)

( * ) Notice: Subject to any disclaimer, the term of this patent is extended or adjusted under 35 U.S.C. 154(b) by 0 days.

(21) Appl. No.: 14/196,474

(22) Filed: Mar. 4, 2014

(65) Prior Publication Data
US 2014/0183677 A1 Jul. 3, 2014

Related U.S. Application Data

(62) Division of application No. 13/356,104, filed on Jan. 23, 2012, now Pat. No. 8,704,322.

(30) Foreign Application Priority Data

Jan. 27, 2011 (JP) ................................ 2011-015580

(51) Int. Cl.
*H01L 31/0232* (2014.01)
*H01L 27/144* (2006.01)
(Continued)

(52) U.S. Cl.
CPC ........ *H01L 27/1446* (2013.01); *H01L 31/0203* (2013.01); *H01L 31/022408* (2013.01); *H01L 31/02327* (2013.01); *H01L 31/105* (2013.01); *H01L 2224/48091* (2013.01); *H01L 2224/49175* (2013.01); *H01L 2224/73265* (2013.01)

USPC ........... 257/432; 257/449; 257/471; 257/472; 257/473; 257/E21.359; 257/E31.127; 257/E31.128

(58) Field of Classification Search
USPC .......... 257/432, 449, 471, 472, 473, E21.359, 257/E31.127, E31.128
See application file for complete search history.

(56) References Cited

U.S. PATENT DOCUMENTS

| 6,061,111 A | 5/2000 | Kataoka et al. |
| 6,949,770 B2 | 9/2005 | Yamaguchi et al. |
| 7,262,436 B2 | 8/2007 | Kondoh et al. |

FOREIGN PATENT DOCUMENTS

| CN | 1819274 | 8/2006 |
| CN | 202817007 U | 3/2013 |

(Continued)

OTHER PUBLICATIONS

U.S. Appl. No. 13/356,104, filed Mar. 15, 2013, Non-Final Office Action.

(Continued)

*Primary Examiner* — Andy Huynh
(74) *Attorney, Agent, or Firm* — Workman Nydegger

(57) ABSTRACT

The present invention is intended to provide a compact and simple optical semiconductor device that reduces crosstalk (leakage current) between light receiving elements. According to the present invention, since a back surface electrode is a mirror-like thin film, crosstalk to an adjacent light receiving element can be suppressed, thereby reducing a detection error of a light intensity. By disposing a patterned back surface electrode or by disposing an ohmic electrode at the bottom of an insulating film over the whole back surface, contact resistance on the back surface can be reduced. By using the optical semiconductor elements with a two-dimensional arrangement and by using a mirror-like thin film as the back surface electrode, crosstalk can be reduced. By accommodating the optical semiconductor elements in the housing in a highly hermetic condition, the optical semiconductor elements can be protected from an external environment.

14 Claims, 17 Drawing Sheets

(51) Int. Cl.
*H01L 31/0203* (2014.01)
*H01L 31/0224* (2006.01)
*H01L 31/105* (2006.01)

(56) References Cited

FOREIGN PATENT DOCUMENTS

| JP | 07-050404 | 2/1995 |
|---|---|---|
| JP | 2003-249675 | 9/2003 |
| JP | 2007-266251 | 10/2007 |

OTHER PUBLICATIONS

U.S. Appl. No. 13/356,104, filed Aug. 27, 2013, Final Office Action.
U.S. Appl. No. 13/356,104, filed Dec. 9, 2013, Notice of Allowance.
Office Action in corresponding Japanese Application No. 2011-015580 dated Jan. 29, 2013.
Notice of Allowance issued in Japanese Application No. 2011-015580 dated Jun. 11, 2013.
Office Action in corresponding Chinese Patent Application No. 201210017208.5 dated Dec. 26, 2013.
Office Action received in corresponding Chinese Application No. 201210017208.5 dated Sep. 2, 2014.

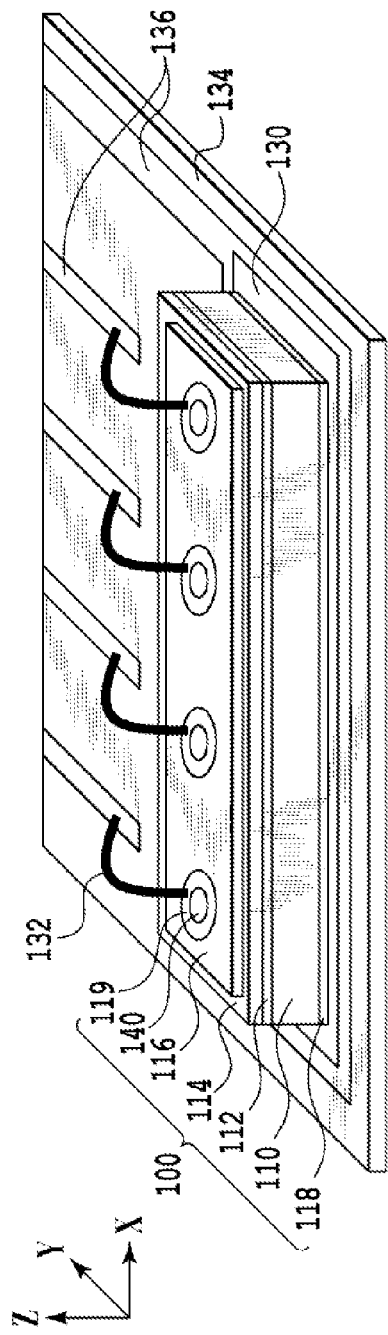
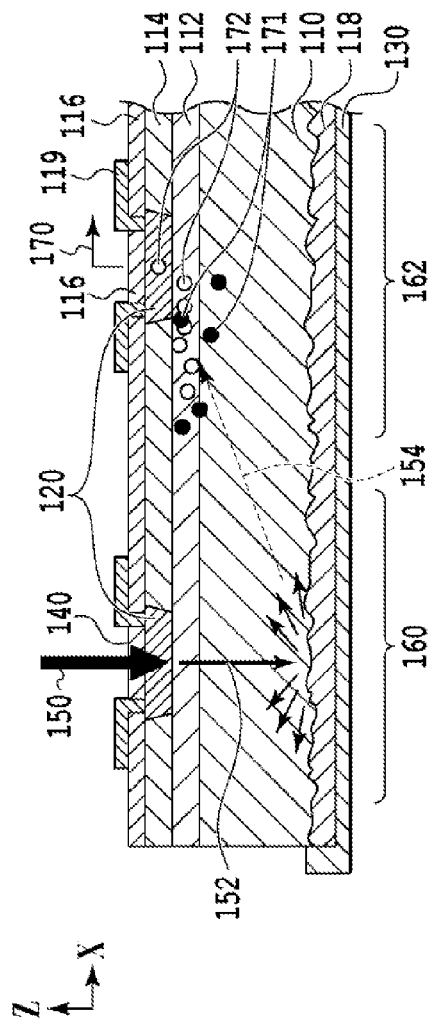

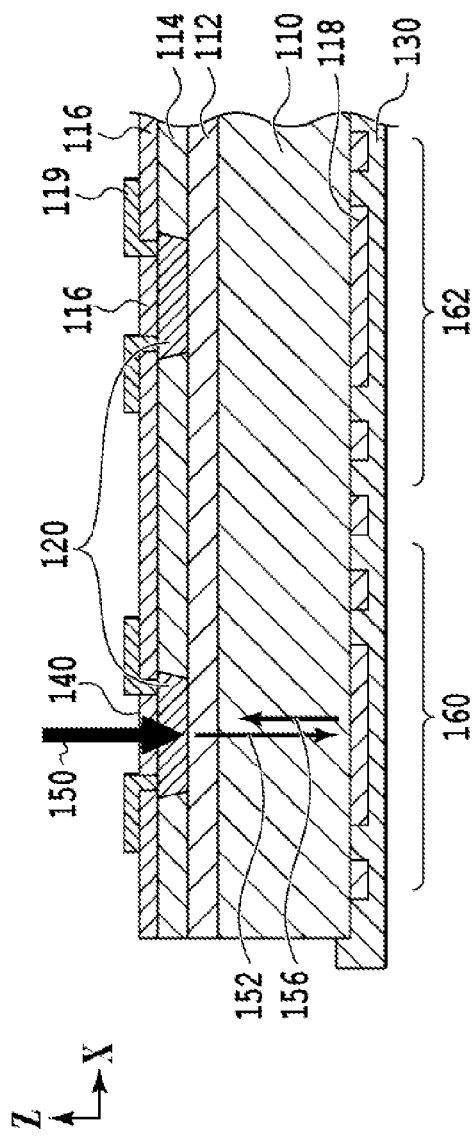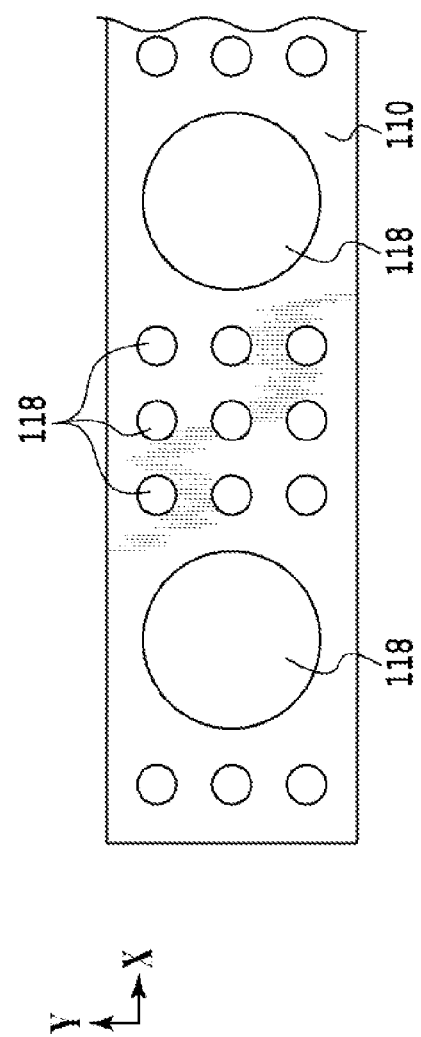
FIG. 6A
FIG. 6B

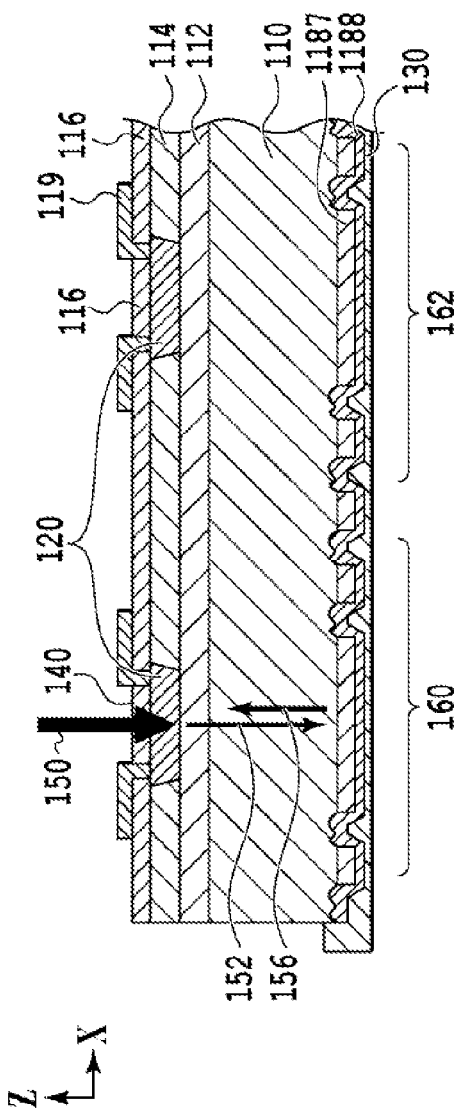
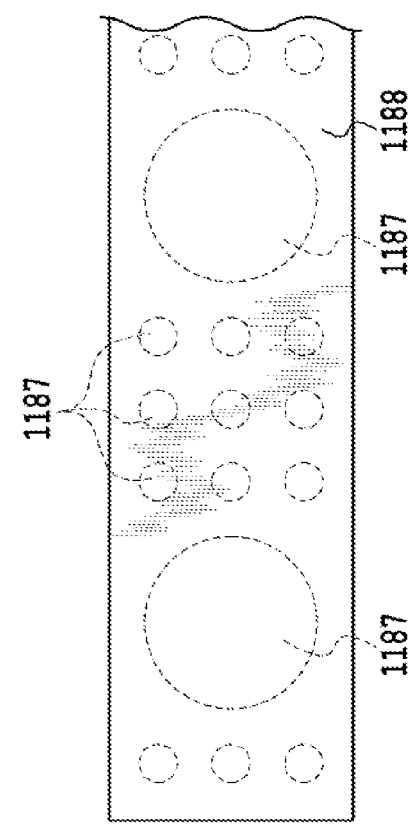

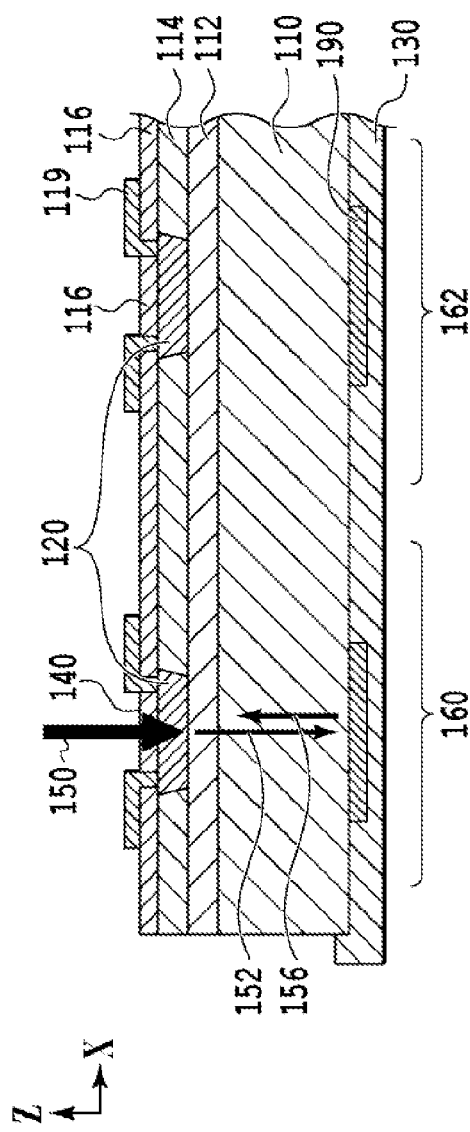
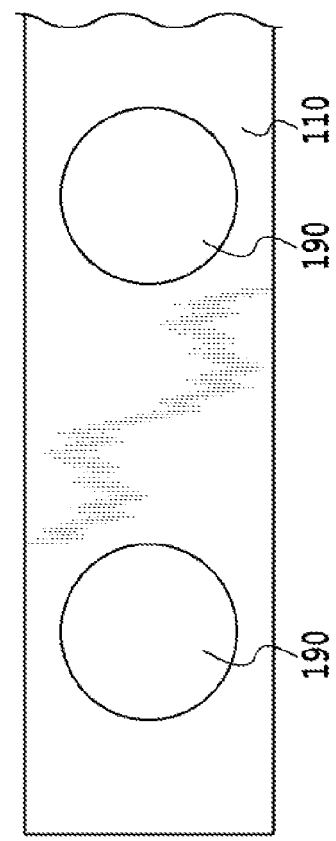
FIG.11A
FIG.11B

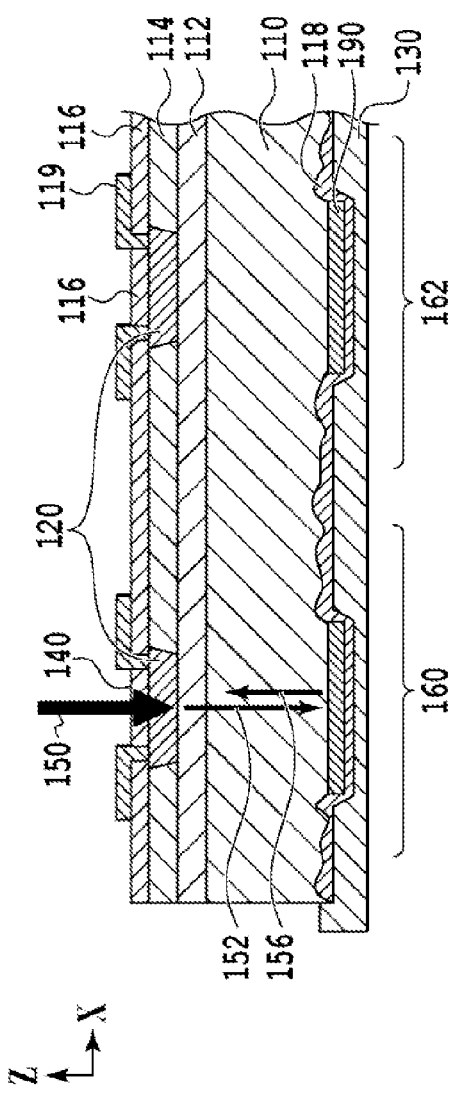
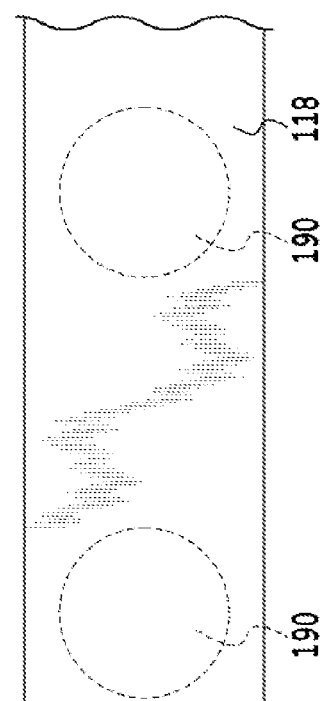
FIG.13A
FIG.13B

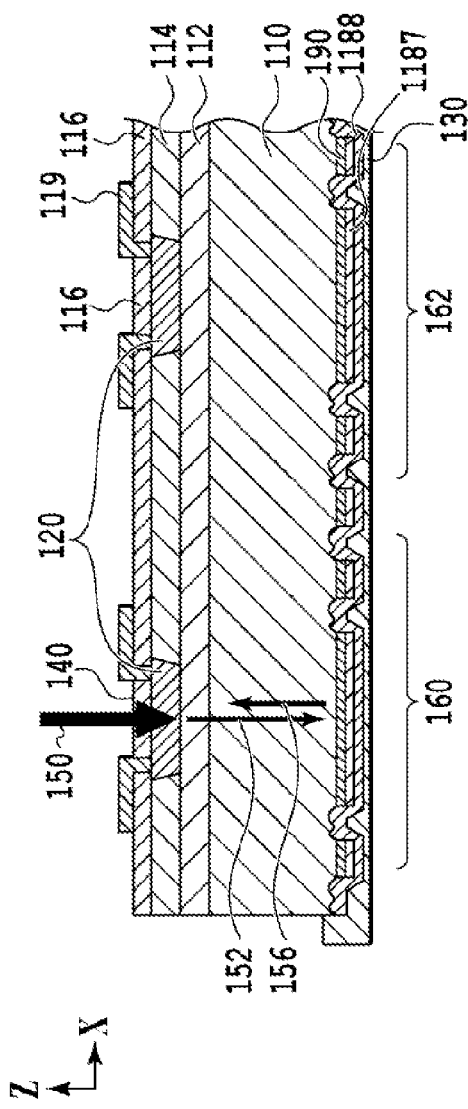
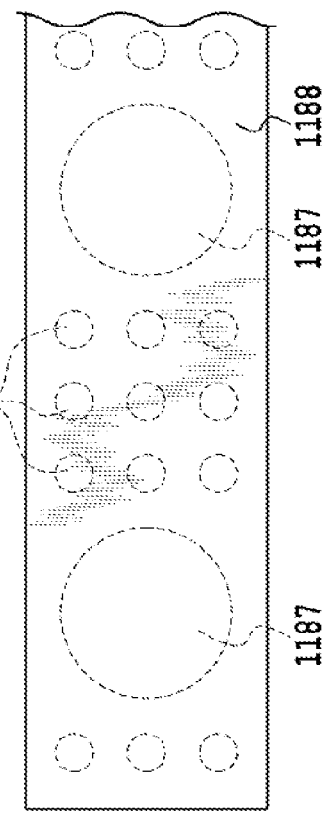
FIG. 14A
FIG. 14B

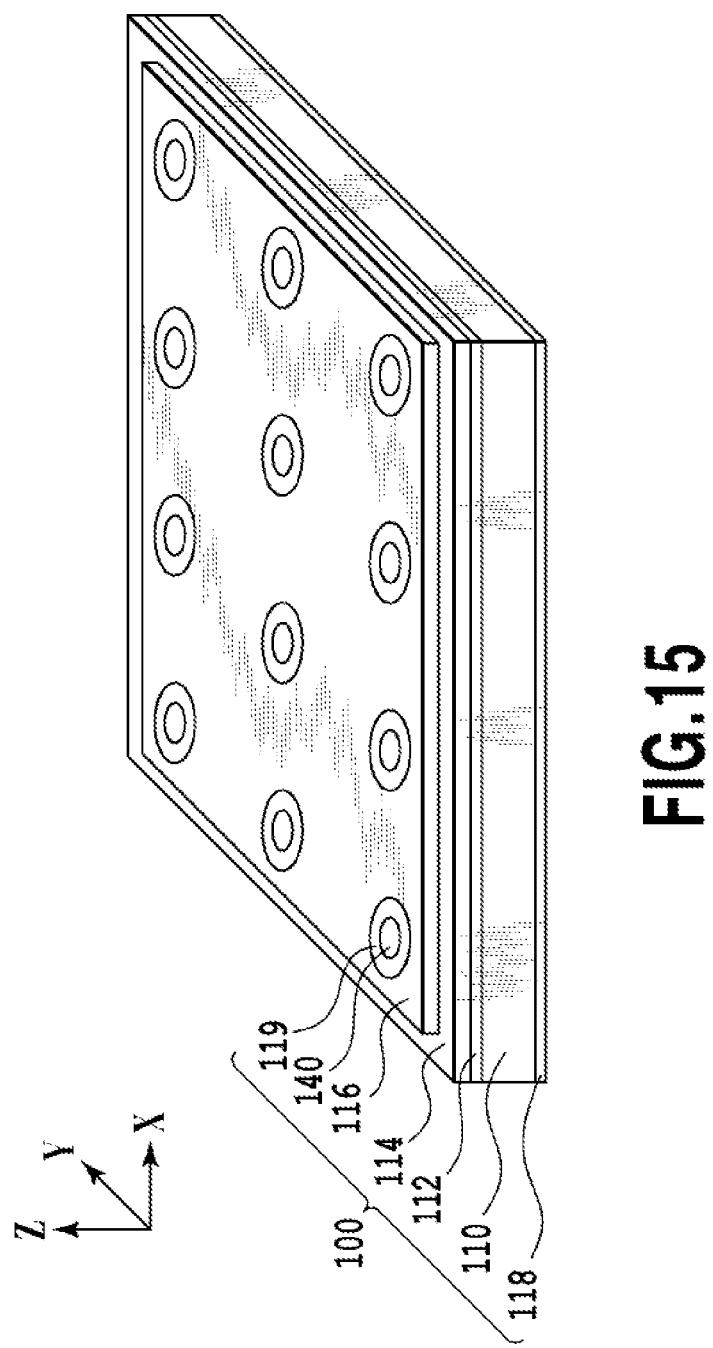

OPTICAL SEMICONDUCTOR DEVICE

CROSS REFERENCE TO RELATED APPLICATIONS

This application is a divisional application of U.S. patent application Ser. No. 13/356,104 filed on Jan. 23, 2012, which claims the benefit of Japanese Patent Application No. 2011-015580 filed Jan. 27, 2011, each of which is hereby incorporated by reference in its entirety.

BACKGROUND OF THE INVENTION

1. Field of the Invention

The present invention generally relates to an optical semiconductor device that is applied to optical fiber communications, and specifically relates to an array of optical semiconductor light receiving elements as light receiving elements (photodiodes: PDs) that can adapt to multi-channelization.

2. The Related Technology

With the recent development of an optical fiber communication technology such as a multiple wavelength communication, a light receiving element that can detect light having more channels is demanded. Meanwhile, in order to prevent increase of size of a device with multi-channelization, downsizing and integration of a device is also demanded. To fulfill these demands, an optical semiconductor device on which light receiving elements in an array are formed is widely used since it can receive light of multi-channel and is compact.

FIG. 1A is an external view of a conventional optical semiconductor device described in Japanese patent Laid-Open No. 2007-266251. FIG. 1B is a cross-sectional view of the conventional optical semiconductor device, the cross-sectional view including a light receiving section. FIG. 1A illustrates, as an example, an array of optical semiconductor elements, each having a light receiving section, the array being composed of four elements. The number of the elements can be increased or decreased according to application.

The optical semiconductor device in FIGS. 1A and 1B has a light absorbing layer 112 formed on a conductive semiconductor substrate 110, and a plurality of diffusion regions 120 that has a conductive property opposite to that of the conductive semiconductor substrate 110. The light absorbing layer 112 has an insulation property. In such a configuration, immediately on the light absorbing layer 112, a conductive semiconductor layer 114 is disposed, and the diffusion regions 120 are formed in the conductive semiconductor layer 114. On the semiconductor substrate 110, a back surface electrode 118 is formed by, for example, evaporation, and on the conductive semiconductor layer 114, an insulating film 116 and a front surface electrode 119 are formed. In this device, an optical semiconductor element 100 is mounted in such a way that the back surface electrode 118 is fixed with the use of metal solder 130, and the front surface electrode 119 is connected to an electrical wiring 136 formed on an electrical wiring board 134 with the use of a bonding wire 132.

As a material of the optical semiconductor element 100, silicon (Si), germanium (Ge), gallium arsenide (GaAs), indium phosphide (InP) or the like is used. Hereinafter, the optical semiconductor element using an InP-based material, which is widely used for long-distance optical fiber communications, will be described.

The conductive semiconductor substrate 110 is made of n-type InP (carrier concentration: $1 \times 10^{18}$ cm$^{-3}$), the light absorbing layer 112 is made of insulating (n-type) indium gallium arsenide (InGaAs, carrier concentration: $1 \times 10^{14}$ cm$^{-3}$), the conductive semiconductor layer 114 is made of n-type InP (carrier concentration: $1 \times 10^{17}$ cm$^{-3}$), and the diffusion regions 120 formed in the conductive semiconductor layer 114 are made of Zn-doped p-type InP (carrier concentration: $1 \times 10^{18}$ cm$^{-3}$). For the insulating film 116 formed on the conductive semiconductor layer 114, silicon nitride (SiN) is used. The insulating film 116 has a passivation function for semiconductor junction, and also serves as an anti-reflective coating when light enters.

A light receiving diameter of a light receiving section 140 is 80 µm; an interval between light receiving elements is 250 µm; and a thickness of the conductive semiconductor substrate 110 is about 200 µm.

In order that the back surface electrode 118 effectively functions as a common cathode of the array of light receiving elements, an ohmic electrode is commonly disposed. That is, an alloy is inserted for reducing a Schottky barrier at an interface between the InP substrate 110 and the metal solder 130. Since this conventional example uses an n-type substrate, an alloy of germanium containing gold and nickel is used. The alloy is deposited on the InP substrate by evaporation, and after that gold and germanium are diffused into InP by heat treatment, thereby reducing the Schottky barrier and making the interface ohmic. Although not illustrated in FIG. 1, on the bottom of the ohmic electrode 118, an electrode that contains titanium, platinum, gold or the like may be further added.

Operation of the optical semiconductor device illustrated in FIGS. 1A and 1B will be described. First, a reverse bias voltage is applied between the front surface electrode 119 and the back surface electrode 118. As illustrated in FIG. 1B, most of incident light 150 inputted into the light receiving section 140 thorough the insulating film 116 from the surface is photoelectrically converted into both carriers of electrons 171 and holes 172 in the light absorbing layer 112. In the light absorbing layer 112 (insulating InGaAs) that was depleted by the reverse bias voltage, a gradient of an energy band occurs. Accordingly, each of the carriers, electrons 171 and holes 172 generated in the light absorbing layer 112 move by drift to the semiconductor substrate 110 (n-type InP) and the p-type diffusion regions 120 (p-type InP), respectively, and are finally emitted outside from the electrodes formed on the front and back surfaces.

Part of the incident light 150 inputted to the light absorbing layer 112 is not completely photoelectrically converted in the light absorbing layer 112, and becomes a substrate-transmitting light 152. The substrate-transmitting light 152 is reflected by the back surface electrode 118 and part of the reflected light may be inputted into the light absorbing layer 112 again, but some of the light reaches an adjacent element 162, as indicated by a dashed line arrow 154 in FIG. 1B.

SUMMARY OF THE INVENTION

In the conventional optical semiconductor device illustrated in FIG. 1, there is a problem that when part of the substrate-transmitting light 152 reflected by the back surface electrode 118 reaches the adjacent element 162 and the light absorbing layer 112 near the adjacent element 162 as described above, crosstalk (leakage current) 170 occurs in the adjacent element 162. The occurrence of the leakage current 170 causes a problem that a detection error of a light intensity may occurs in monitoring a light intensity in optical fiber communications.

As a result of analyzing factors of such crosstalk, the following three phenomena are estimated to be main factors: (1) light crosstalk that reaches an adjacent element due to diffuse reflection by a back surface of a substrate (2) electrical crosstalk due to diffusion of carriers (electrons and holes) generated by light that reaches an absorbing layer near an adjacent element, (3) crosstalk due to some phenomena including the (1) and (2) phenomena that are exercised by substrate-transmitting light that was not completely photoelectrically converted in a light absorbing layer of an input element.

Prior literatures disclose measures against the phenomena (2) and (3).

First, with respect to the phenomenon (2), Japanese patent Laid-Open No. 2007-266251 discloses a structure in which a second semiconductor junction layer is provided between light receiving elements. Accordingly, carriers that are generated in an absorbing layer near an adjacent element can be extracted by drift, thereby reducing the crosstalk.

Next, with respect to the phenomenon (3), by a method such as thickening the light absorbing layer or providing a plurality of light absorbing layers, the substrate-transmitting light can be reduced, thereby reducing the crosstalk. However, the substrate-transmitting light cannot be completely suppressed. Therefore, it is an important problem to reduce the crosstalk due to the diffuse reflection at the back surface in the phenomenon (1).

However, the prior literature does not disclose a technique for reducing the diffuse reflection at the back surface in the phenomenon (1).

A cause to generate the diffuse reflection will be described with the use of FIG. 1B. On the bottom of the conductive semiconductor substrate 110, the ohmic electrode is disposed as the back surface electrode 118. In such an ohmic electrode, gold and germanium are diffused into InP by heat treatment as described above, which roughens the interface between InP and the ohmic alloy. FIG. 1B schematically illustrates the rough interface between the back surface electrode 118 and InP. This roughness of the back surface causes the diffuse reflection, thereby causing the problem of generating the crosstalk to an adjacent element. The present invention has been made in view of such a problem and is intended to provide a compact and simple optical semiconductor device that can sufficiently reduce a leakage current between light receiving elements.

The present invention provides an optical semiconductor device that includes a conductive semiconductor substrate, a light absorbing layer formed on the conductive semiconductor substrate, and a conductive semiconductor layer formed on the light absorbing layer, in which the conductive semiconductor layer has a plurality of diffusion layers that have a conductivity property opposite to that of the conductive semiconductor substrate thereby to form light receiving elements in an array and the bottom of the conductive semiconductor substrate is provided with a mirror-like thin film.

In one embodiment of the present invention, the mirror-like thin film includes a back surface electrode containing barrier metal.

In one embodiment of the present invention, the mirror-like thin film is patterned.

In one embodiment of the present invention, the mirror-like thin film is patterned, and the optical semiconductor device has a second back surface electrode formed on the bottom of the mirror-like thin film, the second back surface electrode being an ohmic electrode.

In one embodiment of the present invention, the mirror-like thin film includes an insulating film.

In one embodiment of the present invention, the mirror-like thin film includes an insulating film and a back surface electrode at the bottom of the insulating film.

In one embodiment of the present invention, the mirror-like thin film includes an insulating film and a back surface electrode at the bottom of the insulating film, and is patterned.

In one embodiment of the present invention, the mirror-like thin film includes an insulating film and a first back surface electrode at the bottom of the insulating film, and is patterned, and the semiconductor device has a second back surface electrode formed at the bottom of the mirror-like thin film, the second back surface electrode being an ohmic electrode.

In one embodiment of the present invention, the optical semiconductor device is accommodated in a housing.

In one embodiment of the present invention, the light receiving elements are two-dimensionally arranged.

In the semiconductor device according to the present invention, by employing the mirror-like thin film as the back surface electrode, a leakage current to an adjacent light receiving element can be easily suppressed, thereby reducing a detection error of a light intensity in an optical semiconductor device.

Further, by disposing the patterned back surface electrode or the ohmic electrode on the bottom of the insulating film over the whole back surface, a contact resistance on the back surface can be reduced.

Further, by using the two-dimensionally arranged optical semiconductor elements and by using the mirror-like thin film as the back surface electrode, crosstalk can be reduced.

By accommodating the optical semiconductor element in the housing in a highly hermetic condition, the optical semiconductor element can be protected from an external environment, be excellent in humidity resistance and have high reliability.

Further features of the present invention will become apparent from the following description of exemplary embodiments with reference to the attached drawings.

BRIEF DESCRIPTION OF THE DRAWINGS

FIGS. 1A and 1B are views for explaining a structure of a conventional optical semiconductor device, in which FIG. 1A is an external view and FIG. 1B is a cross sectional view;

FIGS. 2A and 2B are views for explaining a structure of an optical semiconductor device according to a first embodiment of the present invention, in which FIG. 2A is a cross sectional view and FIG. 2B is a detailed view of a back surface structure;

FIGS. 5A and 5B are views for explaining a structure of an optical semiconductor device according to a second embodiment of the present invention, in which FIG. 5A is a cross sectional view and FIG. 5B is a bottom view;

FIGS. 6A and 6B are views for explaining a structure of an optical semiconductor device according to a variation of the second embodiment of the present invention, in which FIG. 6A is a cross sectional view and FIG. 6B is a bottom view;

FIGS. 7A and 7B are views for explaining a structure of an optical semiconductor device according to a third embodiment of the present invention, in which FIG. 7A is a cross sectional view and FIG. 7B is a bottom view;

FIGS. 8A and 8B are views for explaining a structure of an optical semiconductor device according to a variation of the third embodiment of the present invention, in which FIG. 8A is a cross sectional view and FIG. 8B is a bottom view;

FIGS. 11A and 11B are views for explaining a structure of an optical semiconductor device according to a fifth embodiment of the present invention, in which FIG. 11A is a cross sectional view and FIG. 11B is a bottom view;

FIGS. 12A and 12B are views for explaining a structure of an optical semiconductor device according to a variation of the fifth embodiment of the present invention, in which FIG. 12A is a cross sectional view and FIG. 12B is a bottom view;

FIGS. 13A and 13B are views for explaining a structure of an optical semiconductor device according to a sixth embodiment of the present invention, in which FIG. 13A is a cross sectional view and FIG. 13B is a bottom view;

FIGS. 14A and 14B are views for explaining a structure of an optical semiconductor device according to a variation of the sixth embodiment of the present invention, in which FIG. 14A is a cross sectional view and FIG. 14B is a bottom view;

FIG. 15 is a perspective view for explaining a structure of an optical semiconductor device according to a seventh embodiment of the present invention;

DESCRIPTION OF THE EMBODIMENTS

Figure 2A:
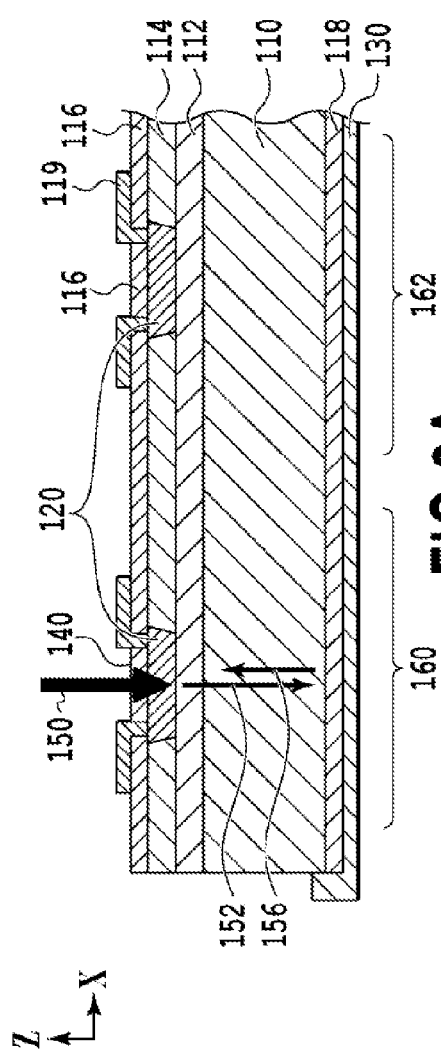
Figure 2B:
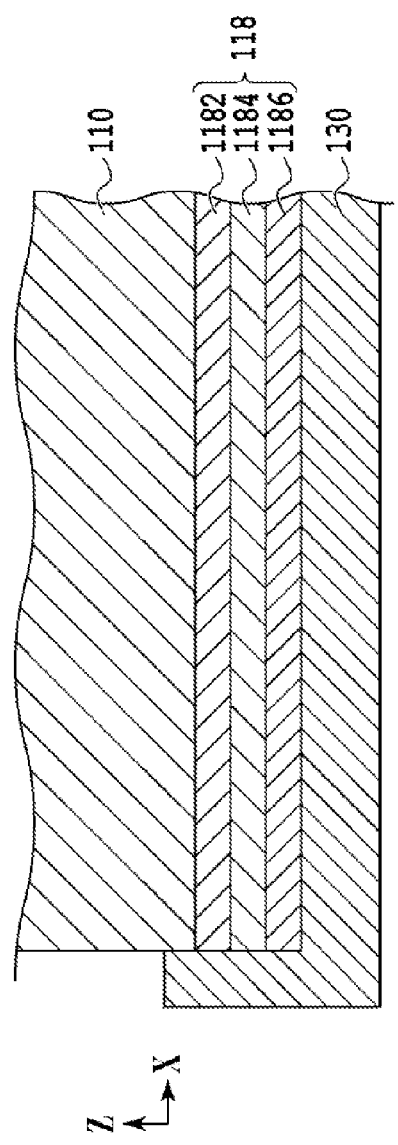

An optical semiconductor device according to a first embodiment of the present invention will be described with reference to FIGS. 2 to 4. FIGS. 2A and 2B are views illustrating a configuration of the optical semiconductor device, in which FIG. 2A is a cross sectional view including a light receiving section and FIG. 2B is a detailed view of a back surface structure. FIG. 2A illustrates, as an example, an array of optical semiconductor elements that include a plurality of light receiving sections, but the number of the elements may be increased or decreased according to application.

The optical semiconductor device illustrated in FIG. 2 has a light absorbing layer 112 formed on a conductive semiconductor substrate 110 and a plurality of conductive diffusion regions 120 that have a conductive property opposite to that of the conductive semiconductor substrate 110. This light absorbing layer 112 has an insulation property. In this configuration, a conductive semiconductor layer 114 is disposed immediately on the light absorbing layer 112, and the diffusion regions 120 are formed in the conductive semiconductor layer 114. On the semiconductor substrate 110, a back surface electrode 118 is formed by evaporation or the like, and on the conductive semiconductor layer 114, an insulating film 116 and a front surface electrode 119 are formed.

As a material constituting the optical semiconductor element, silicon (Si), germanium (Ge), gallium arsenide (GaAs), indium phosphide (InP) or the like is used. In this embodiment, the optical semiconductor element made of an InP-based material, which is widely used for a long-distance optical fiber communication, will be described, as with a conventional example.

The conductive semiconductor substrate 110 is made of n-type InP (carrier concentration: $1 \times 10^{18}$ cm$^{-3}$), the light absorbing layer 112 is made of insulating (n-type) indium gallium arsenide (InGaAs, carrier concentration: $1 \times 10^{14}$ cm$^{-3}$); the conductive semiconductor layer 114 is made of n-type InP (carrier concentration: $1 \times 10^{17}$ cm$^{-3}$); and the diffusion regions 120 formed in the conductive semiconductor layer 114 are made of doped p-type InP (carrier concentration: $1 \times 10^{18}$ cm$^{-3}$). For the insulating film 116 formed on the conductive semiconductor layer 114, silicon nitride (SiN) is used. This insulating film 116 has a passivation function for semiconductor junction, and also serves as an anti-reflective coating when light enters.

A light receiving diameter of the light receiving section 140 is 80 μm an interval between light receiving elements is 250 μm, and a thickness of the conductive semiconductor substrate 110 is about 200 μm.

A structural difference from the cross-sectional view of the conventional example in FIG. 1B is a structure of the back surface electrode 118. That is, in the present invention, the back surface of the semiconductor substrate 110 is provided with, as the back surface electrode 118, a mirror-like thin film, instead of ohmic metal made of an alloy. A material of the mirror-like thin film may be selected from various materials such as metals and insulating films. In the present embodiment, metal that contains barrier metal is used. The barrier metal is metal that is inserted between diffusible materials in order to prevent interdiffusion between the materials. Since gold wiring and gold-tin solder are used in the present embodiment, platinum is used as the barrier metal for preventing diffusion of gold and InP.

Details of a back surface structure will be described with reference to FIG. 2B. First, titanium 1182, which has good adhesion with InP, is attached by evaporation onto the bottom of the n-type InP that is the conductive semiconductor substrate 110. Then, platinum 1184, which is the barrier metal, is attached onto the bottom of the titanium 1182 by evaporation. Further, gold 1186 is attached onto the bottom of the platinum 1184 by evaporation. A thickness of each of the layers is about 500 Å. In such a structure, interdiffusion between InP and gold is unlikely to occur during heating process or the like by inserting the barrier metal between them. Accordingly, it is observed under an SEM microscope that an interface between InP and the back surface metal comes into a flat and smooth state, and a good mirror-like thin film is formed.

Operation of the optical semiconductor device according to the present embodiment will be described. First, a reverse bias voltage is applied between the front surface electrode 119 and the back surface electrode 118. As illustrated in FIG. 2A, most of incident light 150 inputted into the light receiving section 140 through the insulating film 116 from the surface is photoelectrically converted in the light absorbing layer 112 into both carriers of electrons and holes. In the light absorbing layer 112 (insulating InGaAs) that was depleted by the reverse bias voltage, a gradient of an energy band occurs. Accordingly, each of the carriers, i.e., electrons and holes, generated in the light absorbing layer 112 move by drift to the semiconductor substrate 110 (n-type InP) and the p-type diffusion regions 120 (p-type InP), respectively, and are finally emitted outside from the electrodes formed on the front and back surfaces.

Part of the incident light 150 inputted into the light absorbing layer 112 is not completely photoelectrically converted in the light absorbing layer 112 and becomes substrate-transmitting light 152. The substrate-transmitting light 152 is reflected by the back surface electrode 118. Since the back surface electrode 118 is a mirror-like thin film, it exhibits reflection operation like not diffuse reflection but specular reflection on the back surface. Therefore, light that reaches an adjacent element by diffuse reflection on the back surface as in the conventional example can be reduced and reduction of crosstalk can be expected.

Figure 3:
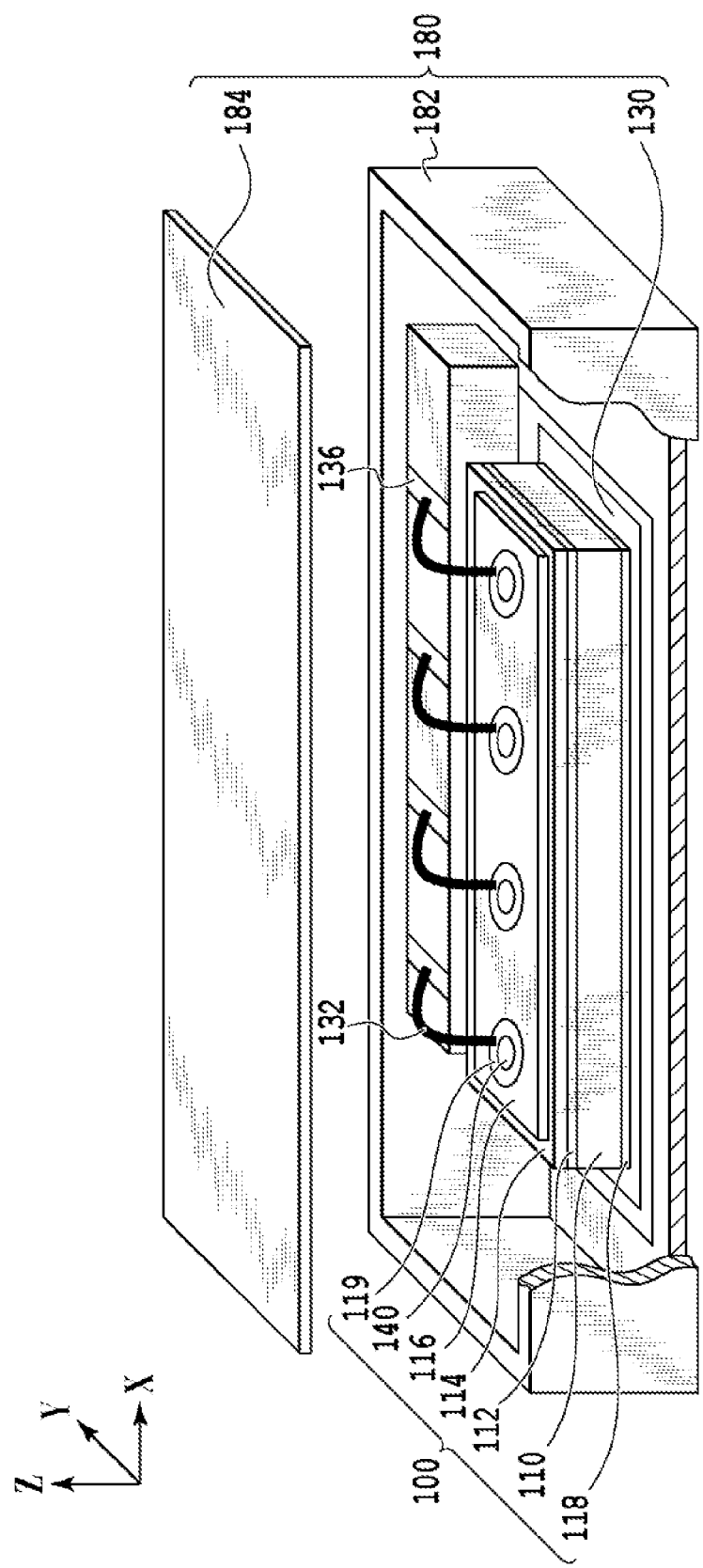
FIG. 3 is a view for explaining a structure of an optical semiconductor element according to the first embodiment of the present invention, in which the optical semiconductor element is accommodated in a housing.

The optical semiconductor element illustrated in FIG. 2 can be accommodated in a housing 182 and a window lid 184 as illustrated in FIG. 3. The optical semiconductor element 100 is accommodated in the box-shaped housing 182 made of ceramic, and is hermetically sealed with this housing 182 and the window lid 184 made of sapphire or the like that enables light to enter the light receiving section 140. Since the housing 182 and the window lid 184 are bonded by the metal solder 130 (not shown), the optical semiconductor element can be protected from an external environment, be excellent in humidity resistance and have high reliability in a highly hermetic condition. The optical semiconductor element 100 is accommodated in such a way that the light receiving section 140 faces the window lid 184, the back surface electrode 118 and the housing 182 are fixed to each other by the metal solder 130 or the like, and the front surface electrode 119 is connected to the electrical wiring 136 in the housing by the bonding wire 132. The electrical wiring 136 in the housing 182 penetrates through the housing 182 to the surface of the housing 182 (not shown), allowing for an electrical connection to an electrical wiring board connected to outside.

Figure 4:
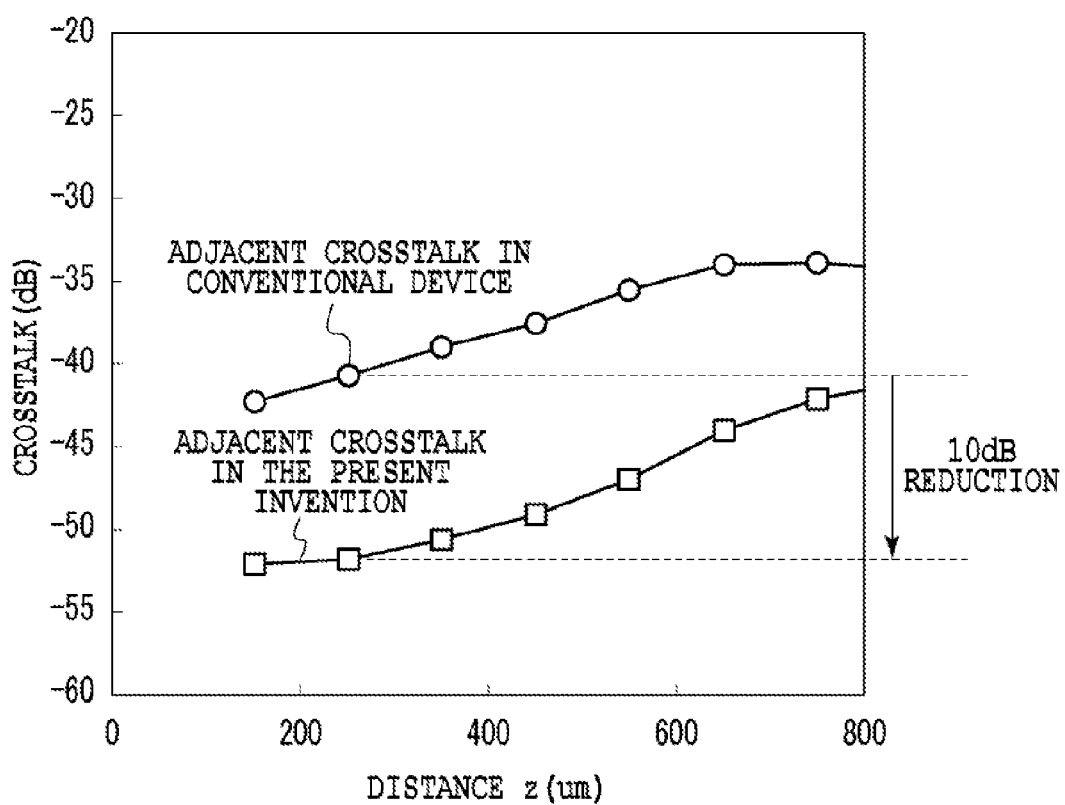
FIG. 4 is a graph showing an evaluation result of the semiconductor element according to the first embodiment of the present invention.

FIG. 4 shows a result of evaluating an amount of crosstalk when light was inputted from an optical fiber. This evaluation was performed in such a way that the optical semiconductor element 100 was mounted on the housing 182 illustrated in FIG. 3, and light was inputted into the light receiving section 140 with the use of the optical fiber without sealing by the window lid 184. Measurement was performed with the use of input light having a wavelength of 1.55 µm in a room temperature environment. A crosstalk value of a vertical axis is a ratio between a light receiving current in a light-inputted element and a light receiving current in an adjacent element. In doing measurement, by changing a distance (z) between the light receiving section and an end face of the optical fiber, a change of crosstalk was observed.

The result of the above experiment shows that an adjacent crosstalk value is −35 dB to −42 dB in a region of z<600 µm in the conventional element whereas an adjacent crosstalk value is −45 dB to −52 dB in the element of the present invention, causing the reduction in crosstalk by 10 dB.

In the present embodiment, since an ohmic electrode is not used as the back surface electrode 118, the InP substrate 110 has a Schottky contact with the back surface electrode 118, causing a concern of contact resistance. However, since the back surface electrode 118, which is a common electrode, has a large attachment area, increase of contact resistance often does not matter in quality under a normal operating condition. For example, if the resistance increases by about 1Ω, degradation of a band is about 50/51, which is subtle, in a transmission path with a load resistance of 50Ω. In addition, a voltage drop due to contact resistance is about 1 mV at a light receiving current of 1 mA, which is subtle and can be ignored.

In the present embodiment, the conductive semiconductor substrate 110 is n-type, but P-type conductive semiconductor substrate 110, which has an opposite conductive property, has the same improving effect. In such a case, the conductive semiconductor substrate 110 is p-type, the light absorbing layer 112 is p-type, the conductive semiconductor layer 114 is p-type, and the diffusion regions 120 formed in the conductive semiconductor layer 114 are n-type.

In the present embodiment, since the back surface exhibits the reflection operation like specular reflection, an amount of the substrate-transmitting light 152 inputted to the light absorbing layer 112 of the light-inputted element 160 increases, thereby exhibiting an effect to increase light receiving sensitivity of the light-inputted element 160.

Figure 5A:
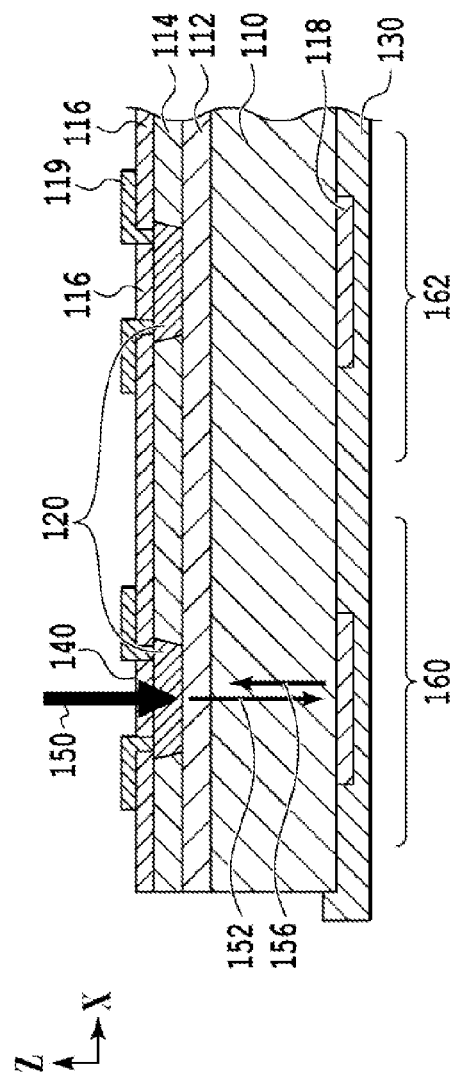
Figure 5B:
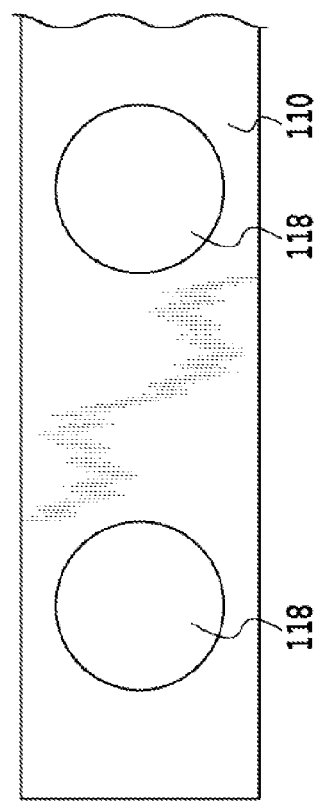

An optical semiconductor device according to a second embodiment of the present invention will be described with reference to FIGS. 5A and 5B. FIGS. 5A and 5B are views illustrating a configuration of the optical semiconductor device, in which FIG. 5A is a cross sectional view including a light receiving section and FIG. 5B is a bottom view before metal-soldering.

As with the first embodiment, such an optical semiconductor device has the light absorbing layer 112 formed on the conductive semiconductor substrate 110 and has the plurality of diffusion regions 120 that have a conductive property opposite to that of the conductive semiconductor substrate 110. Description of configurations of the carrier concentration, electrodes, and the like is left out since the configurations are the same as those of the first embodiment.

The present embodiment is structurally different from the first embodiment in that, in the present embodiment, the back surface electrode 118 is not a full-surface electrode but patterned. The patterning is performed by a lift-off process in which the bottom of the conductive semiconductor substrate 110 is coated with organic resist and exposed. A patterned position is on the side opposite to each of the light receiving sections 140 on the surface of the light receiving element through the InP substrate 110. That is, the patterned electrode on the back surface is positioned so that an optical axis passing through each of the light receiving sections is in the center of the patterned electrode. In the present embodiment, as illustrated in FIG. 5B, the patterned electrode is circular and the diameter of the electrode is ϕ=200 µm. In a region without the patterned electrode, the conductive semiconductor substrate 110 is uncovered.

The back surface electrode is formed by not using ohmic alloy metal but placing a mirror-like thin film as with the first embodiment. In the present embodiment, as with the first embodiment, metal that contains barrier metal is used. In the present embodiment, since gold wiring and gold-tin solder are used, platinum is used as the barrier metal for preventing diffusion of gold and InP. On the bottom of the n-type InP that is the conductive semiconductor substrate 110, titanium, platinum and gold are attached in this order by evaporation. A thickness of each of the layers is about 500 Å.

Such a structure, as with the first embodiment, suppresses interdiffusion between InP and gold, thereby forming a good mirror-like thin film. In addition, in the present embodiment, since the back surface electrode is not disposed over the whole back surface, an area of platinum, which tends to generate stress due to heat change, can be reduced. Therefore, a thin film can be formed that maintains a mirror-like surface in spite of heat change and is unlikely to be peeled off.

Operation of the optical semiconductor device according to the present embodiment will be described. As with the first embodiment, first, a reverse bias voltage is applied between the surface electrode 119 and the back surface electrode 118. As illustrated in FIG. 5A, most of the incident light 150 inputted into the light receiving section 140 through the insulating film 116 from the surface is photoelectrically converted in the light absorbing layer 112. However, part of the incident light 150 inputted into the light absorbing layer 112 is not completely photoelectrically converted in the light absorbing layer 112 and becomes the substrate-transmitting light 152, which is reflected by the back surface electrode 118. Since the back surface electrode 118 is a mirror-like thin film, the back surface exhibits reflection operation like not diffuse reflection but specular reflection. Therefore, light that reaches an adjacent element by the diffuse reflection on the back surface as in the conventional example can be reduced, thereby reducing crosstalk.

In the present embodiment, since an ohmic electrode is not used as the back surface electrode 118, the InP substrate 110 has a Schottky contact with the back surface electrode 118. In addition, the back surface electrode 118 is patterned. Therefore, increase of contact resistance is more concerned than in the first embodiment. However, as with the first embodiment, since the back surface electrode 118, which is a common electrode, has a large attachment area, increase of contact resistance often does not matter in quality under a normal operating condition.

Next, a variation of the second embodiment will be described with reference to FIGS. 6A and 6B. FIGS. 6A and 6B are views illustrating a configuration of a semiconductor device, in which FIG. 6A is a cross sectional view including a light receiving section and FIG. 6B is a bottom view.

This structure is different from that of the embodiment illustrated in FIGS. 5A and 5B with respect to a pattern shape of the back surface. In the present embodiment, in addition to the pattern (diameter: 200 μm) placed so that an optical axis passing through a light receiving section is in the center of the pattern, back surface electrodes, each having a small diameter (diameter: 50 μm), are placed around the pattern.

In addition to effects of the invention in the embodiment illustrated in FIGS. 5A and 5B, in such a structure, tight adhesion between the back surface electrodes having a small diameter and metal solder increases adhesive strength between the optical semiconductor element and the metal solder, thereby enabling the optical semiconductor element to strongly be fixed to the electric wiring and housing. A larger area of the back surface electrode can reduce contact resistance.

Figure 7A:
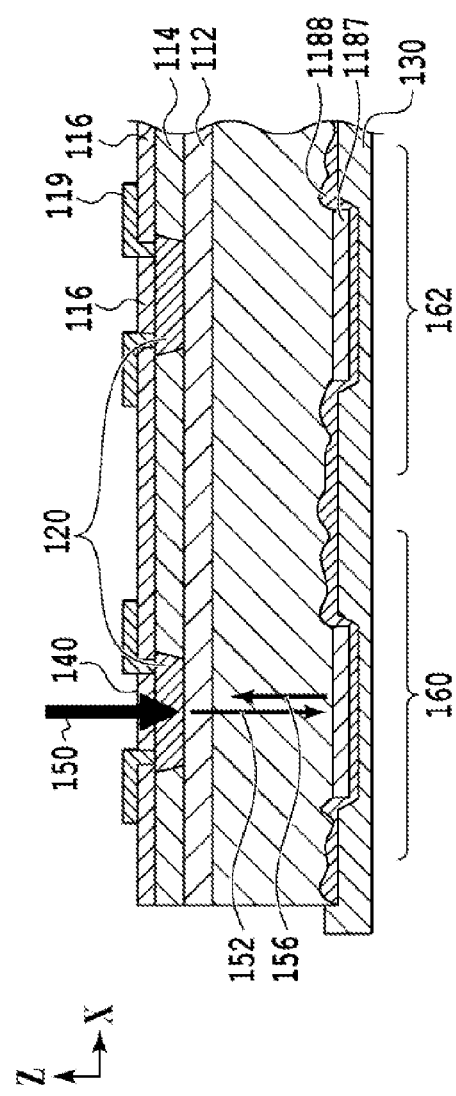
Figure 7B:
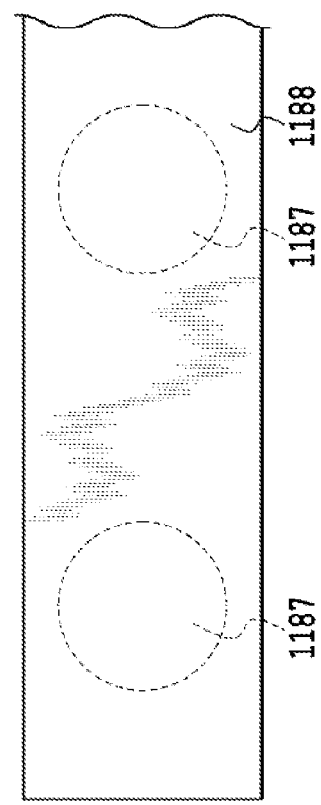

An optical semiconductor device according to a third embodiment of the present invention will be described with reference to FIGS. 7A and 7B. FIGS. 7A and 7B are views illustrating a configuration of the optical semiconductor device, in which FIG. 7A is a cross sectional view including a light receiving section and FIG. 7B is a bottom view.

As with the above embodiments, such an optical semiconductor device has the light absorbing layer 112 formed on the conductive semiconductor substrate 110 and has the plurality of diffusion regions 120 that have an conductive property opposite to that of the conductive semiconductor substrate 110. Description of configurations of the carrier concentration, electrodes, and the like is left out since the configurations are the same as those of the above embodiments.

The present embodiment is structurally different from the above embodiments in that in the present embodiment after an electrode containing barrier metal is disposed as a first back surface electrode 1187 on the back surface, an ohmic electrode is further disposed as a second back surface electrode 1188. In the present embodiment, the first back surface electrode 1187 is not a full-surface electrode but patterned, and on the bottom of the first back surface electrode 1187, the ohmic electrode is further disposed as the second back surface electrode 1188 over the whole back surface. The method and structure of the patterning are the same as those of the second embodiment. That is, the pattern is created by a lift-off process and is positioned opposite to each light receiving section 140 on the surface of the light receiving element through the InP substrate 110. As illustrated in FIG. 7B, the pattern of the first back surface electrode 1187 is circular and the diameter of the pattern is ϕ=200 μm. In the present embodiment, since the ohmic electrode is further disposed as the second back surface electrode 1188, the whole bottom surface looks like an ohmic electrode at first glance.

The first back surface electrode 1187 is composed of metal that contains barrier metal, as with the above embodiments. On the bottom of n-type InP that is the conductive semiconductor substrate 110, titanium, platinum and gold are attached in this order by evaporation. A thickness of each of the layers is about 500 Å. Meanwhile, for the second back surface electrode 1188, an alloy of germanium-containing gold and nickel is used. The alloy is deposited on the InP substrate 110 by evaporation and then heat-treated so that gold and germanium that contact InP are diffused into InP, thereby reducing a Schottky barrier and making the interface ohmic.

Such a configuration, as with the above embodiments, suppresses interdiffusion between InP and gold, thereby forming a good mirror-like thin film. In addition, since the first back surface electrode 1187 is not disposed over the whole surface, an area of platinum, which tends to generate stress due to heat change, can be reduced. Therefore, a thin film can be formed that maintains a mirror-like surface in spite of heat change and is unlikely to be peeled off. Further, in this structure, since ohmic contact is formed in a region where the first back surface electrode is not disposed, contact resistance can be reduced.

Operation of the optical semiconductor device according to the present embodiment will be described. First, a reverse bias voltage is applied between the front surface electrode 119 and the back surface electrode 1187. As illustrated in FIG. 7A, most of the incident light 150 inputted into the light receiving section 140 through the insulating film 116 from the surface is photoelectrically converted in the light absorbing layer 112. However, part of the incident light 150 inputted into the light absorbing layer 112 is not completely photoelectrically converted in the light absorbing layer 112 and becomes the substrate-transmitting light 152, which is reflected by the first back surface electrode 1187. Since the first back surface electrode 1187 is a mirror-like thin film, the back surface exhibits not diffuse reflection but reflection operation like specular reflection. Therefore, light that reaches an adjacent element 162 by diffuse reflection on a back surface as in the conventional example can be reduced, thereby reducing crosstalk.

An interface between InP and the back surface where the first back surface electrode 1187 is not disposed becomes rough due to ohmic processing. However, there is little substrate-transmitting light 152 that reaches the region, an effect of scattering can be ignored.

In the present embodiment, compared with the above embodiments, since the ohmic contact is formed in the region where the first back surface electrode 1187 is not disposed, contact resistance can be reduced. According to current-voltage characteristics of a produced element, an increase of contact resistance was within 1Ω which indicates good characteristics.

Next, a variation of the third embodiment will be described with reference to FIGS. 8A and 8B. FIGS. 8A and 8B are views illustrating a configuration of a semiconductor device, in which FIG. 8A is a cross sectional view including a light receiving section and FIG. 8B is a bottom view.

This structure is different from that of the embodiment in FIGS. 7A and 7B with respect to a pattern shape of the back surface. In the present embodiment, in addition to the pattern (diameter: 200 μm) placed so that an optical axis passing through the light receiving section 140 is in the center of the pattern, back surface electrodes each having a small diameter (about 50 μm) are placed around the pattern.

In addition to effects of the invention in the embodiment illustrated in FIGS. 7A and 7B, in such a structure, tight adhesion between the back surface electrodes having a small diameter and metal solder increases adhesive strength between the optical semiconductor element and the metal solder, thereby enabling the optical semiconductor element to strongly be fixed to the electric wiring and housing. As a result of subjecting a produced optical semiconductor element to delamination test (die shear test), it turns out that when pressing force is applied from the short side, a mean strength is 2 kgf for 3 samples. This is equivalent to a die shear strength of the conventional example.

Figure 9:
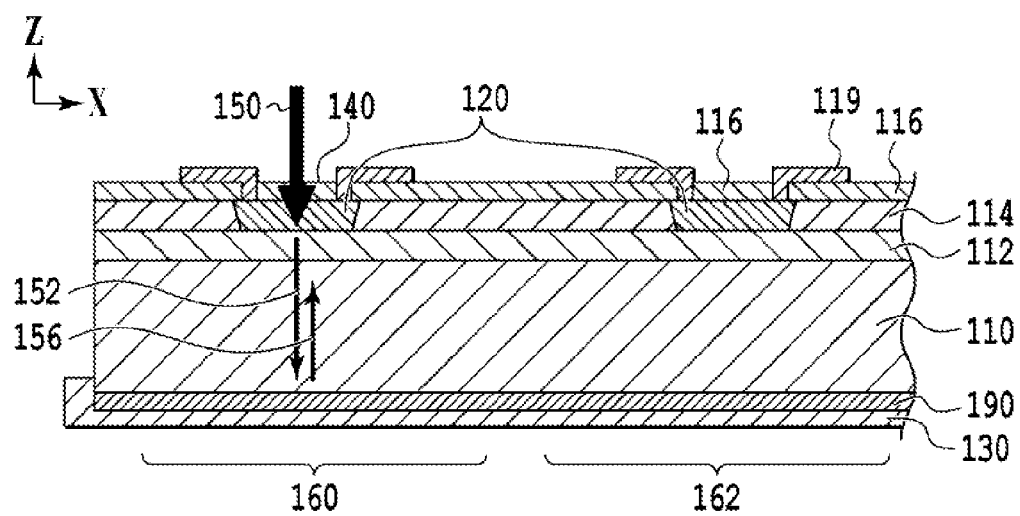
FIG. 9 is a cross sectional view for explaining a structure of an optical semiconductor device according to a fourth embodiment of the present invention.

An optical semiconductor device according to a fourth embodiment of the present invention will be described with reference to FIG. 9. FIG. 9 is a cross sectional view of the optical semiconductor device including a light receiving section.

As with the above embodiments, such an optical semiconductor device has the light absorbing layer 112 formed on the conductive semiconductor substrate 110 and has the plurality of diffusion regions 120 that have a conductive property opposite to that of the conductive semiconductor substrate 110. Description of configurations of the carrier concentration, electrodes, and the like is left out since the configurations are the same as those of the above embodiments.

The present embodiment is structurally different from the above embodiments in that in the present embodiment, an insulating film 190 is disposed as a mirror-like thin film. In the present embodiment, the insulating film 190 using silicon nitride is deposited over the whole back surface by a vapor phase growth method.

Operation of the optical semiconductor device according to the present embodiment will be described. First, a reverse bias voltage is applied between the front surface electrode 119 and the metal solder 130. As illustrated in FIG. 9, most of the incident light 150 inputted into the light receiving section 140 through the insulating film 116 from the surface is photoelectrically converted in the light absorbing layer 112. However, part of the incident light 150 inputted into the light absorbing layer 112 is not completely photoelectrically converted in the light absorbing layer 112 and becomes the substrate-transmitting light 152, which transmits through the insulating film 190 and is reflected by the metal solder 130 on the bottom of the insulating film 190. Since the insulating film 190 and metal solder 130 are not so affected by interdiffusion and the like, the metal solder 130 serves as a mirror-like thin film and accordingly the back surface exhibits not diffuse reflection but reflection operation like specular reflection. Therefore, light that reaches an adjacent element 162 by diffuse reflection on the back surface as in the conventional example can be reduced, thereby reducing crosstalk.

Between the insulating film 190 and the metal solder 130 on the back surface is electrically insulated. Accordingly, conduction between the conductive semiconductor substrate 110 and the metal solder 130 is made in such a way that the metal solder 130 goes around the insulating film to contact to the side surface of the conductive semiconductor substrate 110. Therefore, since the InP substrate 110 has a Schottky contact with the metal solder 130, increase of contact resistance is concerned. However, by securing an area where the metal solder 130 contacts to the side surface by, for example, increasing an amount of the metal solder 130, the increase of contact resistance often does not matter in quality under a normal operating condition.

Figure 10:
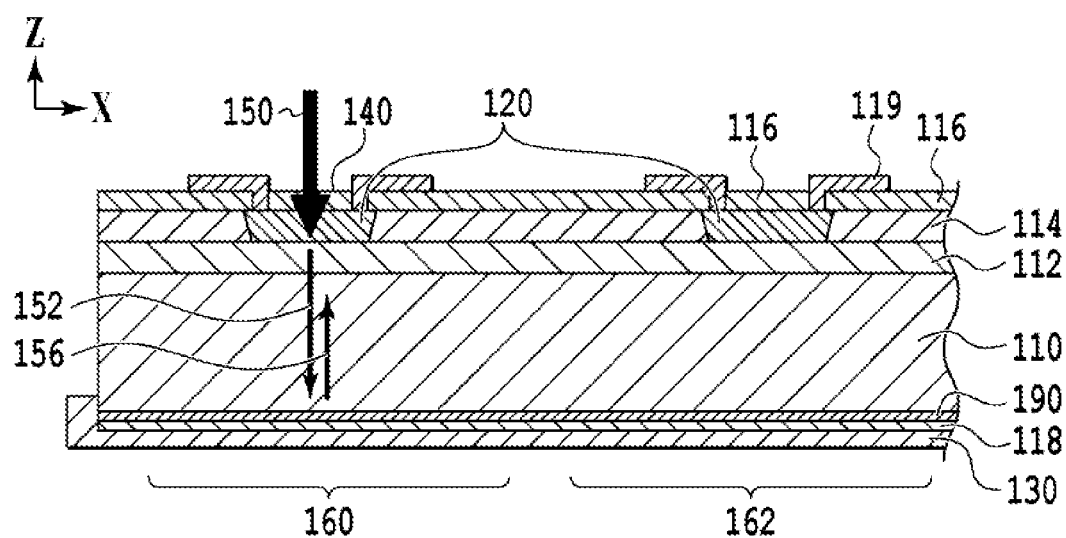
FIG. 10 is a cross sectional view for explaining a structure of an optical semiconductor device according to a variation of the fourth embodiment of the present invention.

Next, a variation of the fourth embodiment will be described with reference to FIG. 10. FIG. 10 is a cross sectional view of an optical semiconductor device including a light receiving section.

This structure is different from that of the embodiment illustrated in FIG. 9 in that in this structure, the back surface electrode 118 is further disposed on the bottom of the insulating film 190 disposed on the back surface. In addition, by setting a thickness of the insulating film 190 to about 0.2 μm, a high reflectance condition for the incident light is fulfilled. Since the insulating film 190 is disposed between the back surface electrode 118 and InP, interdiffusion between the back surface electrode 118 and InP does not occur. Therefore, the back surface electrode 118 may be composed of metal that does not contain barrier metal, such as metal composed of only titanium and gold.

In addition to effects of the invention in the embodiment illustrated in FIG. 9, in such a structure, existence of the back surface electrode enables a more stable mirror-like thin film to be formed than the thin film by metal solder. Since the insulating film fulfills a high reflectance condition, a reflectance is more improved than that of the embodiment in FIG. 9, thereby reducing crosstalk and improving light receiving sensitivity. If the back surface electrode does not contain barrier metal, stress due to heat change does not occur and therefore a thin film can be formed that maintains a mirror-like surface in spite of heat change and is unlikely to be peeled off.

An optical semiconductor device according to a fifth embodiment of the present invention will be described with reference to FIGS. 11A and 11B. FIGS. 11 A and 11B are views illustrating a configuration of the optical semiconductor device, in which FIG. 11A is a cross sectional view including a light receiving section and FIG. 11B is a bottom view before metal-soldering.

As with the above embodiments, such an optical semiconductor device has the light absorbing layer 112 formed on the conductive semiconductor substrate 110 and has the plurality of diffusion regions 120 that have a conductive property opposite to that of the conductive semiconductor substrate 110. Description of configurations of the carrier concentration, electrodes, and the like is left out since the configurations are the same as those of the above embodiments.

The present embodiment is structurally different from the above embodiment in that in the present embodiment, the insulating film 190 is disposed as a mirror-like thin film and the insulating film 190 is not disposed over the whole surface but patterned. The patterning is performed in such a way that patterned metal is formed on the insulating film 190 by a lift-off process and etching is carried out using the metal as a mask.

A position to be patterned is opposite to each light receiving section on the surface of the light receiving element through the InP substrate from. That is, the pattern on the back surface is positioned so that an optical axis passing through the light receiving section is in the center of the pattern. In the present embodiment, as illustrated in FIG. 11B, the pattern of the electrodes is circular and a diameter of the pattern is p=200 μm. In a region without any pattern, the conductive semiconductor substrate 110 is uncovered.

Operation of the optical semiconductor device according to the present embodiment will be described. As with the above embodiment, first, a reverse bias voltage is applied between the front surface electrode 119 and the metal solder 130. As illustrated in FIG. 11A, most of the incident light 150 inputted into the light receiving section 140 through the insulating film 116 from the surface is photoelectrically converted in the light absorbing layer 112. However, part of the incident light 150 inputted into the light absorbing layer 112 is not completely photoelectrically converted in the light absorbing layer 112 and becomes the substrate-transmitting light 152, which passes through the insulating film 190 and is reflected by the metal solder 130 on the bottom of the insulating film 190. Since the insulating film 190 and metal solder 130 are not so affected by interdiffusion, the metal solder 130 serves as a mirror-like thin film and accordingly the back surface exhibits not diffuse reflection but reflection operation like specular reflection. Therefore, light that reaches an adjacent element 162 by diffuse reflection on the back surface as in the conventional example can be reduced, thereby reducing crosstalk.

Between the insulating film 190 and the metal solder 130 on the back surface is electrically insulated. Accordingly, conduction between the conductive semiconductor substrate 110 and the metal solder 130 is made in such a way that an uncovered region of the conductive semiconductor substrate 110 contacts to the metal solder 130 and the metal solder 130 goes around to contact to the side surface of the conductive semiconductor substrate 110. Therefore, since the InP substrate 110 has a Schottky contact with the metal solder 130, increase of contact resistance is concerned. However, by making a contact area between the uncovered region of the conductive semiconductor substrate 110 and the metal solder 130 larger or by securing an area where the metal solder 130 contacts to the side surface by, for example, increasing an amount of the metal solder 130, the increase of contact resistance often does not matter in quality under a normal operating condition.

Figure 12A:
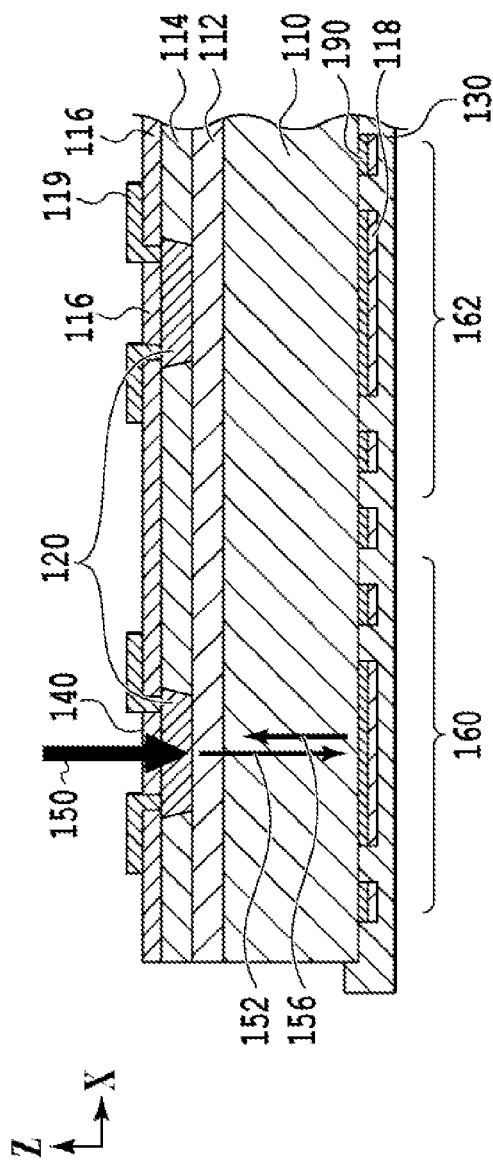
Figure 12B:
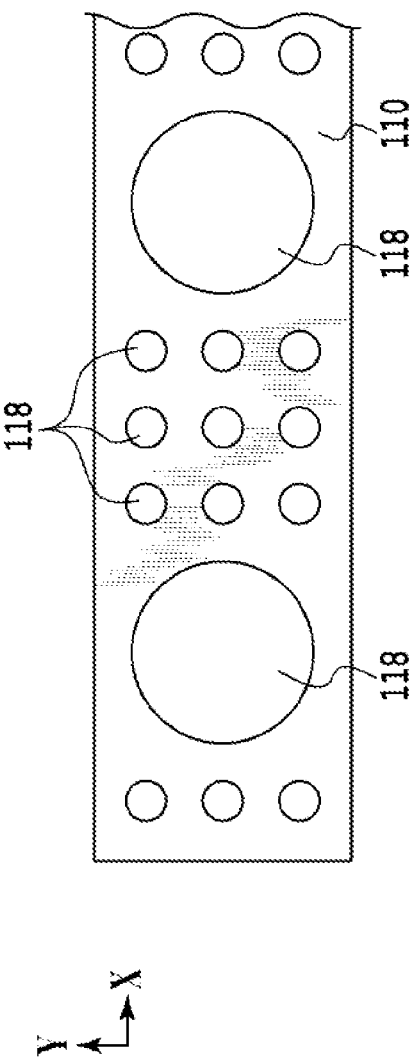

Next, a variation of the fifth embodiment will be described with reference to FIGS. 12A and 12B. FIGS. 12A and 12B are views illustrating a configuration of the optical semiconductor device, in which FIG. 12A is a cross sectional view including a light receiving section and FIG. 12B is a bottom view before metal-soldering.

This structure is different from that of the embodiment illustrated in FIGS. 11A and 11B in that in this structure, the back surface electrode 118 is further disposed on the bottom of the insulating film 190 disposed on the back surface. In addition, a high reflectance condition for the incident light is fulfilled by setting a thickness of the insulating film 190 to about 0.2 μm. Since the insulating film 190 is disposed between the back surface electrode 118 and InP, interdiffusion between the back surface electrode 118 and InP does not occur. Therefore, the back surface electrode 118 may be composed of metal that does not contain barrier metal, such as metal composed of only titanium and gold.

Further, this structure is different from that of the embodiment illustrated in FIGS. 11A and 11B with respect to a pattern shape of the back surface. In the present embodiment, in addition to a pattern (diameter: 200 μm) placed so that an optical axis passing through the light receiving section 140 is in the center of the pattern, back surface electrodes, each having a small diameter (diameter: 50 μm), are placed around the pattern.

In addition to effects of the invention in the embodiment illustrated in FIG. 10, in such a structure, tight adhesion between the back surface electrodes having a small diameter and metal solder increases adhesive strength between the optical semiconductor element and the metal solder, thereby enabling the optical semiconductor element to be strongly fixed to the electric wiring and housing. Since the insulating film 190 electrically insulates between the back surface electrode 118 and the conductive semiconductor substrate 110, increase of an area of the back surface electrode causes concern of increase of contact resistance. However, by making a contact area between an uncovered region of the conductive semiconductor substrate 110 and the metal solder 130 larger, or by securing an area where the metal solder 130 contact to the side surface by, for example, increasing an amount of the metal solder 130, the increase of contact resistance often does not matter in quality under a normal operating condition. If the back surface electrode does not use barrier metal, stress due to heat change does not occur and therefore a thin film can be formed that maintains a mirror-like surface in spite of heat change and is unlikely to be peeled off.

An optical semiconductor device according to a sixth embodiment of the present invention will be described with the use of FIGS. 13A and 13B. FIGS. 13A and 13B are views illustrating a configuration of the optical semiconductor device, in which FIG. 13A is a cross sectional view including a light receiving section and FIG. 13B is a bottom view.

As with the above embodiments, such an optical semiconductor device has the light absorbing layer 112 formed on the conductive semiconductor substrate 110 and has the plurality of diffusion regions 120 that have a conductive property opposite to that of the conductive semiconductor substrate 110. Description of configurations of the carrier concentration, electrodes, and the like is left out since the configurations are the same as those of the above embodiments.

The present embodiment is structurally different from the above embodiment in that in the present embodiment, the insulating film 190 is disposed as a mirror-like thin film, and on the bottom of the insulating film 190, an ohmic electrode is further disposed as the back surface electrode 118 over the whole back surface. In the present embodiment, the insulating film 190 is patterned, not a whole surface, and on the bottom of the insulating film 190, the ohmic electrode is further disposed as the back surface electrode 118 over the whole back surface. The method and structure of the patterning are the same as those of the fifth embodiment. That is, the patterning is performed by etching with the use of a metal mask produced by a lift-off process and the position of the pattern is opposite to each light receiving section on the surface of the light receiving element through the InP substrate. As illustrated in FIG. 13B, the pattern of the insulating film 190 is circular and the diameter of the pattern is φ=200 μm. In the present embodiment, since the ohmic electrode is further disposed, the whole bottom surface looks like an ohmic electrode at first glance.

An alloy of germanium-containing gold and nickel is used for the back surface electrode 118 to be subjected to ohmic processing. The alloy is deposited on the InP substrate 110 by evaporation and then heat-treated, thereby causing gold and germanium that contact to InP to be diffused into InP and therefore reducing a Schottky barrier and making the interface ohmic.

Operation of the optical semiconductor device according to the present embodiment will be described. First, a reverse bias voltage is applied between the front surface electrode 119 and the back surface electrode 118. As illustrated in FIG. 13A, most of the incident light 150 inputted into the light receiving section 140 through the insulating film 116 from the surface is photoelectrically converted in the light absorbing layer 112. However, part of the incident light 150 inputted into the light absorbing layer 112 is not completely photoelectrically converted in the light absorbing layer 112 and becomes the substrate-transmitting light 152, which passes through the insulating film 190 and is reflected by the back surface electrode 118 on the bottom of the insulating film. Since the insulating film 190 and back surface electrode 118 are not so affected by interdiffusion, the back surface electrode 118 serves as a mirror-like thin film and accordingly the back surface exhibits not diffuse reflection but reflection operation like specular reflection. Therefore, light that reaches an adjacent element 162 by diffuse reflection on the back surface as in the conventional example can be reduced, thereby reducing crosstalk. In addition, since ohmic contact is formed in a region where the insulating film 190 is disposed, contact resistance can be reduced.

An interface between InP and a region of the back surface where the insulating film 190 is not disposed becomes rough. However, since there is little substrate-transmitting light 152 that reaches the region, an effect of scattering can be ignored.

Next, a variation of the sixth embodiment will be described with reference to FIGS. 14A and 14B. FIGS. 14A and 14B are views illustrating a configuration of a semiconductor device, in which FIG. 14A is a cross sectional view including a light receiving section and FIG. 14B is a bottom view.

This structure is different from that of the embodiment illustrated in FIGS. 13A and 13B in that in this structure, the first back surface electrode 1187 is further disposed on the bottom of the insulating film 190 disposed on the back surface and further an ohmic electrode is disposed as the second back surface electrode 1188. By setting a thickness of the insulating film 190 to 0.2 µm, a high reflectance condition for the incident light is fulfilled. Since the insulating film 190 is disposed between the first back surface electrode 1187 and InP, interdiffusion between the first back surface electrode 1187 and InP does not occur. Therefore, the first back surface electrode 1187 may be composed of metal that does not contain barrier metal, such as metal composed of only titanium and gold.

In addition, this structure is different from that of the embodiment illustrated in FIGS. 13A and 13B with respect to a pattern shape of the back surface. In the present embodiment, in addition to a pattern (diameter: 200 µm) placed such that an optical axis passing through the light receiving section is in the center of the pattern, a plurality of back surface electrodes, each having a small diameter (diameter: about 50 µm), are placed around the pattern.

In addition to effects of the invention in the embodiment illustrated in FIGS. 13A and 13B, in such a structure, tight adhesion between the back surface electrodes having a small diameter and the metal solder increases adhesive strength between the optical semiconductor element and the metal solder, thereby enabling the optical semiconductor element to be strongly fixed to the electric wiring and housing. If the back surface electrode does not use barrier metal, stress due to heat change does not occur and therefore a thin film can be formed that maintains a mirror-like surface in spite of heat change and is unlikely to be peeled off.

An optical semiconductor device according to a seventh embodiment of the present invention will be described with the use of FIGS. 15 to 17. In the present embodiment, optical semiconductor elements each in which crosstalk has been reduced using the above embodiment are two-dimensionally disposed.

FIG. 15 illustrates, as an example, an array of the optical semiconductor elements with 12 channels, in which light receiving elements are arranged in 4 rows×3 columns. The number of the elements can be increased or decreased according to application.

As with the above embodiments, such an optical semiconductor device has the light absorbing layer 112 formed on the conductive semiconductor substrate 110 and has the plurality of diffusion regions 120 that have a conductive property opposite to that of the conductive semiconductor substrate 110. Description of configurations of the carrier concentration, electrodes, and the like is left out since the configurations are the same as those of the above embodiments.

In this embodiment, as with the first embodiment, metal that contains barrier metal is disposed as the back surface electrode 118 that is a mirror-like thin film over the whole back surface.

Figure 16:
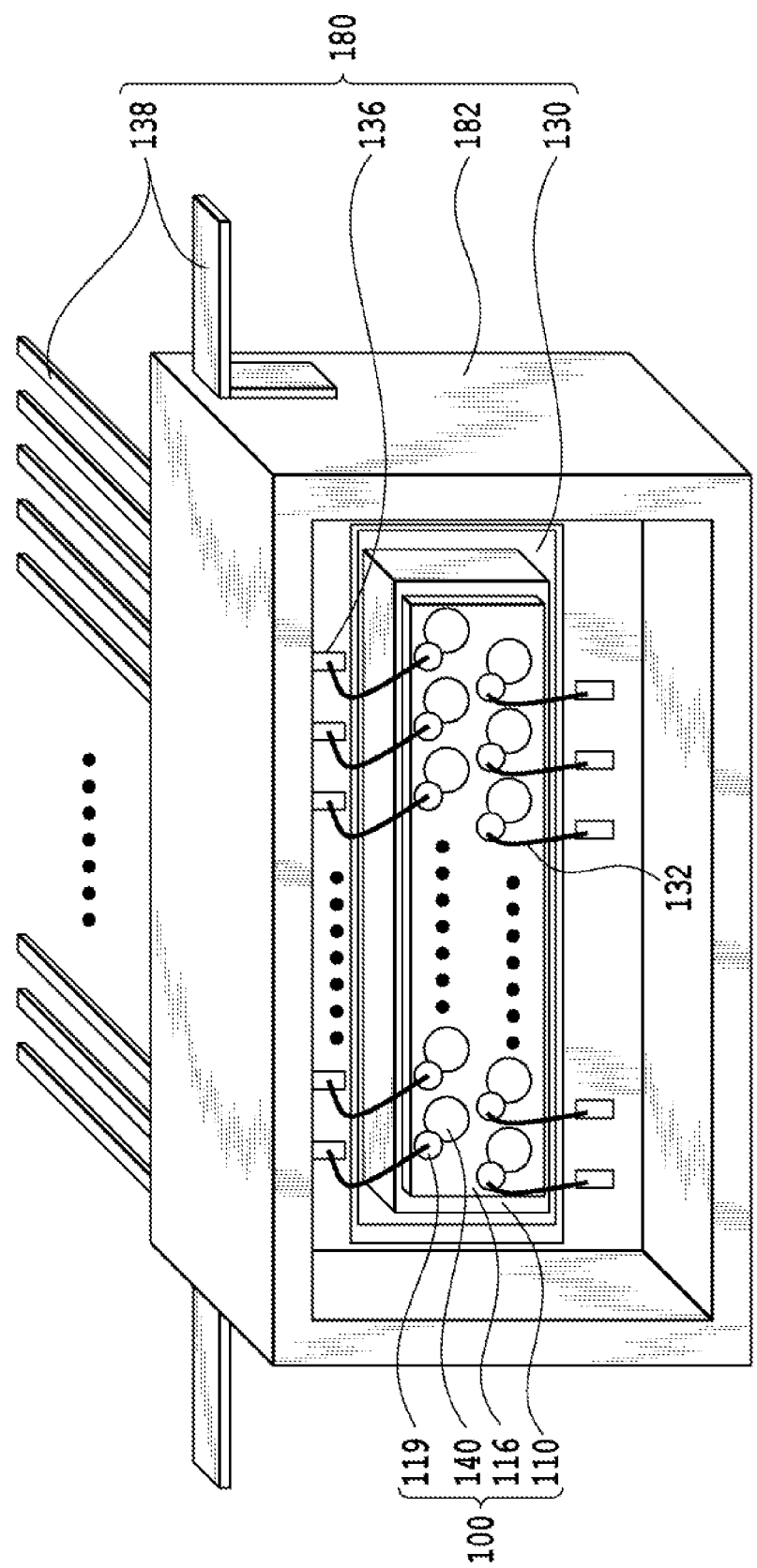
FIG. 16 is a view for explaining a structure of the optical semiconductor element according to the seventh embodiment of the present invention, in which the optical semiconductor element is accommodated in a housing.

In the configuration in FIG. 16, an array of the optical semiconductor elements arranged in 2 lines is accommodated in the housing 182 as illustrated. The optical semiconductor element 100 is accommodated in the box-shape housing 182 made of ceramic. Since this housing 182 and a window lid, which enables light to enter the light receiving section 140, are bonded by metal solder (not shown), the optical semiconductor element 100 can be protected from an external environment, be excellent in humidity resistance and have high reliability in a highly hermetic condition. The optical semiconductor element 100 is accommodated in the housing 182 in such a way that the light receiving section 140 faces the window lid, the back surface electrode and the housing 182 are fixed by the metal solder 130 and the like, and the front surface electrode 119 is connected by the bonding wire 132 to the electrical wiring 136 within the housing 182.

The electrical wiring 136 in the housing penetrates through the housing 182 to the surface of the housing (not shown), allowing for electrical connection to an electric wiring board or the like connected to outside via lead pins 138 fixed to the housing 182.

Figure 17:
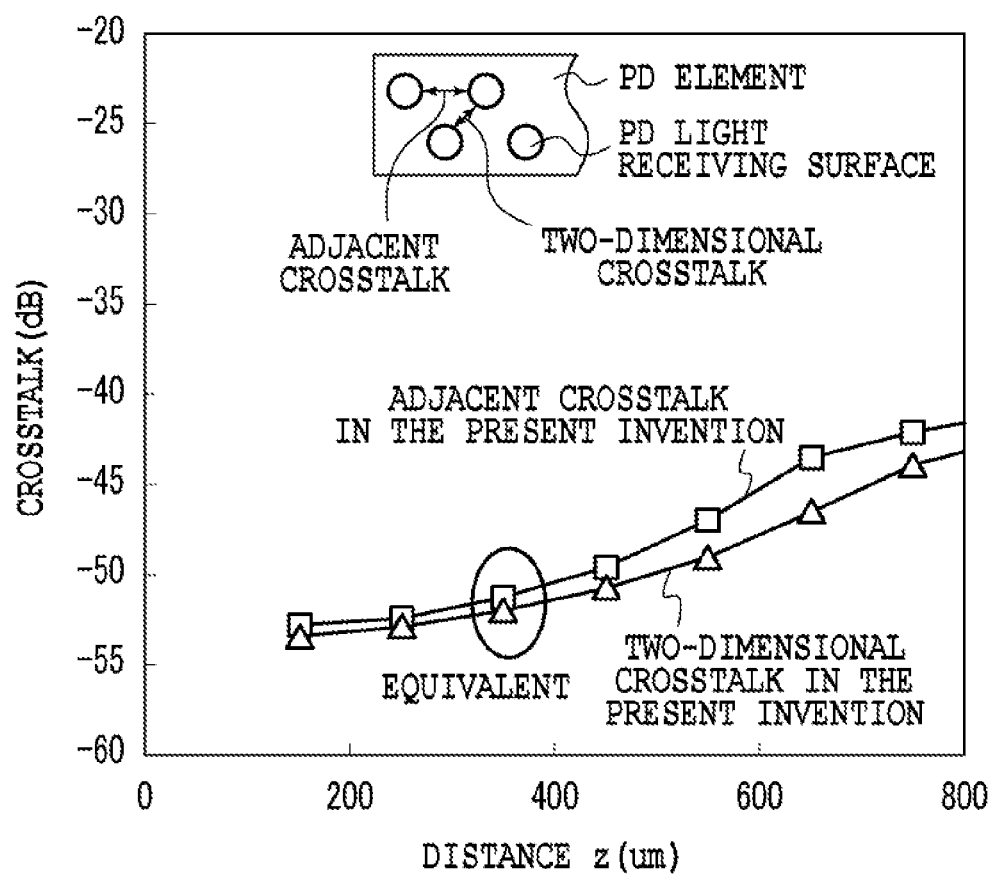
FIG. 17 is a graph showing an evaluation result of the semiconductor element according to the seventh embodiment of the present invention.

FIG. 17 shows a result of evaluation of an amount of crosstalk when light was inputted from an optical fiber. This evaluation was performed in such a way that the optical semiconductor element 100 was mounted on the housing 182 in FIG. 16, and light was inputted into the light receiving section 140 with the use of optical fibers without sealing by the window lid. Then, measurement was performed with the use of incident light having a wavelength of 1.55 µm in a room temperature environment. A crosstalk value of a vertical axis is a ratio of a light receiving current in the light inputted element and a light receiving current in an adjacent element. In doing measurement, by changing a distance (z) between the light receiving section and an end face of the optical fiber, a change of crosstalk was observed.

From the above experiment result, an adjacent crosstalk value in a conventional element is −35 dB to −42 dB in a region of z<600 µm, whereas an adjacent crosstalk value in the element of the present invention is −45 dB to −52 dB, that is, a reduction of 10 dB crosstalk can be identified, as described above (see FIG. 4). Further, a two-dimensional crosstalk has almost the same value as that of the adjacent crosstalk of the present invention, which shows a good crosstalk reduction effect.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:
1. An optical semiconductor device comprising:
a conductive semiconductor substrate;
a light absorbing layer formed on the conductive semiconductor substrate; and
a conductive semiconductor layer formed on the light absorbing layer, wherein the conductive semiconductor layer comprises a plurality of diffusion regions each having a conductive property opposite to a conductive property of the conductive semiconductor substrate thereby to form light receiving elements in an array in the optical semiconductor device, each light receiving element comprising a light receiving section through which light passes into the light receiving element along an optical axis;

and the conductive semiconductor substrate comprises a mirror-like thin film on a bottom thereof, wherein the mirror-like thin film comprises an insulating film positioned on a metal, the mirror-like thin film exhibiting specular reflection, the mirror-like thin film being aligned with the optical axis of one of the light receiving sections.

2. The optical semiconductor device according to claim 1, wherein the mirror-like thin film comprises a back surface electrode on a bottom of the insulating film.

3. The optical semiconductor device according to claim 1, wherein the mirror-like thin film comprises the insulating film and a back surface electrode on a bottom of the insulating film, and is patterned.

4. The optical semiconductor device according to claim 1, wherein the mirror-like thin film comprises the insulating film and a first back surface electrode on a bottom of the insulating film and is patterned, and a second back surface electrode that is an ohmic electrode is formed on a bottom of the mirror-like thin film.

5. The optical semiconductor device according to claim 1, wherein the optical semiconductor device being accommodated in a housing.

6. The optical semiconductor device according to claim 1, wherein the light receiving elements are two-dimensionally arranged.

7. An optical semiconductor device comprising:
a conductive semiconductor substrate comprising a mirror-like thin film on a bottom thereof, the mirror-like thin film comprising:
  a metal layer; and
  an insulating film disposed on the metal layer, the mirror-like thin film exhibiting specular reflection;
a light absorbing layer formed on the conductive semiconductor substrate; and
a conductive semiconductor layer formed on the light absorbing layer, the conductive semiconductor layer comprising a plurality of diffusion regions each having a conductive property opposite to a conductive property of the conductive semiconductor substrate thereby to form light receiving elements in an array in the optical semiconductor device, wherein the mirror-like thin film is aligned with an optical axis that passes through a light receiving section of one of the light receiving elements.

8. The optical semiconductor device according to claim 7, wherein the mirror-like thin film further comprises a back surface electrode on a bottom of the insulating film.

9. The optical semiconductor device according to claim 8, wherein the mirror-like thin film is patterned.

10. The optical semiconductor device according to claim 9, wherein a second back surface electrode that is an ohmic electrode is formed on a bottom of the mirror-like thin film.

11. The optical semiconductor device according to claim 7, wherein the optical semiconductor device is accommodated in a housing.

12. The optical semiconductor device according to claim 7, wherein the light receiving elements are two-dimensionally arranged.

13. The optical semiconductor device according to claim 7, wherein the mirror-like thin film is positioned on optical axes that respectively pass through light receiving sections of the light receiving elements.

14. An optical semiconductor device comprising:
a conductive semiconductor substrate comprising a mirror-like thin film on a bottom thereof, the mirror-like thin film comprising:
  a metal layer; and
  a plurality of insulating films disposed on the metal layer, the mirror-like thin film exhibiting specular reflection;
a light absorbing layer formed on the conductive semiconductor substrate; and
a conductive semiconductor layer formed on the light absorbing layer, the conductive semiconductor layer comprising a plurality of diffusion regions each having a conductive property opposite to a conductive property of the conductive semiconductor substrate thereby to form light receiving elements in an array in the optical semiconductor device, each light receiving element comprising a light receiving section through which light passes into the light receiving element along an optical axis;

wherein the insulating films are each aligned with a respective optical axis of a different one of the light receiving elements.

* * * * *